United States Patent
Haner

(10) Patent No.: US 9,142,342 B2
(45) Date of Patent: Sep. 22, 2015

(54) COMPACT-AREA CAPACITIVE PLATES FOR USE WITH SPIRAL INDUCTORS HAVING MORE THAN ONE TURN

(76) Inventor: Ronald Lambert Haner, Berkeley, CA (US)

(*) Notice: Subject to any disclaimer, the term of this patent is extended or adjusted under 35 U.S.C. 154(b) by 391 days.

(21) Appl. No.: 13/068,726

(22) Filed: May 17, 2011

(65) Prior Publication Data

US 2011/0279198 A1 Nov. 17, 2011

Related U.S. Application Data

(60) Provisional application No. 61/395,831, filed on May 17, 2010.

(51) Int. Cl.

| H01P 3/08 | (2006.01) |
|---|---|
| H01F 41/00 | (2006.01) |
| H01P 1/20 | (2006.01) |
| H01F 17/00 | (2006.01) |
| H03H 7/01 | (2006.01) |

(52) U.S. Cl.
CPC ......... *H01F 17/0006* (2013.01); *H03H 7/0115* (2013.01); *H01F 2017/0026* (2013.01); *H01F 2017/0046* (2013.01); *Y10T 29/4902* (2015.01)

(58) Field of Classification Search
CPC . H01P 7/01; H01P 7/0115; H03H 2001/0078; H03H 2001/0092; H01F 17/0006; H01F 2017/0026; H01F 2017/0046; Y10T 29/4902
USPC ......... 333/185, 175; 336/232, 84 C; 343/895, 343/742
See application file for complete search history.

(56) References Cited

U.S. PATENT DOCUMENTS

| 5,192,911 A | 3/1993 | Hill et al. |
|---|---|---|
| 5,831,331 A * | 11/1998 | Lee ............................... 257/659 |
| 6,498,487 B1 | 12/2002 | Haner |
| 6,593,838 B2 | 7/2003 | Yue |
| 6,611,041 B2 * | 8/2003 | Maeda et al. ................. 257/531 |
| 6,674,285 B2 | 1/2004 | Haner |
| 6,756,656 B2 * | 6/2004 | Lowther ........................ 257/531 |
| 6,950,590 B2 | 9/2005 | Cheung et al. |

(Continued)

OTHER PUBLICATIONS

C. P. Yue and S. S. Wong, "On-chip spiral inductors with patterned ground shields for Si-based RF IC's," IEEE J. Solid-State Circuits, vol. 33, pp. 743-752, May 1998.

(Continued)

*Primary Examiner* — Stephen E Jones
*Assistant Examiner* — Scott S Outten
(74) *Attorney, Agent, or Firm* — Ronald L. Haner

(57) ABSTRACT

A method and an apparatus are described for constructing a compact inductive-capacitive circuit, using a spiral inductor of more than one turn, plus a capacitive plate. This method includes duplicating the layout of the spiral, and then offsetting the duplicate so that the trace pattern of the spiral overlaps its duplicate at an insulating distance away, with the duplicate as an underlying capacitive plate. The plate's trace pattern includes at least one gap, plus an extension of its trace to span the region under the terminals of the spiral inductor. For the case where the spiral inductor has more than one turn—plus an underpass—the capacitive plate may also have more than one turn and may also have an underpass. The resulting pair of underpasses may be either overlapping or nonoverlapping. If overlapping, the full circuit requires at least four metal layers, and at least three if the underpasses are nonoverlapping.

11 Claims, 8 Drawing Sheets

(56) References Cited

U.S. PATENT DOCUMENTS

| | | | |
|---|---|---|---|
| 7,046,113 B1* | 5/2006 | Okamoto et al. | 336/200 |
| 7,750,784 B2* | 7/2010 | Lee | 336/84 C |
| 8,390,417 B2* | 3/2013 | Ueno | 336/200 |
| 2005/0068146 A1* | 3/2005 | Jessie | 336/200 |
| 2007/0069717 A1* | 3/2007 | Cheung et al. | 324/158.1 |
| 2008/0169883 A1* | 7/2008 | Hsu et al. | 333/185 |

OTHER PUBLICATIONS

T. S. D. Cheung and J. R. Long, "Shielded passive devices for silicon-based monolithic microwave and millimeter-wave integrated circuits," IEEE J. Solid-State Circuits, vol. 41, No. 5, pp. 1183-1200, May 2006.

R. L. Haner, S. Krishnan, and S. T. Burns, "Spiral inductors with projected floating shields: an alternative method for RF shielding," IEEE International Symposium on Circuits and Systems, pp. 1771-1774, doi: 10.1109/ISCAS.2009.5118119, May 2009.

Printed poster presented at ISCAS-2009 in Taipei on May 26, 2009: R. L. Haner, S. Krishnan, and S. T. Burns, "Spiral inductors with projected floating shields: an alternative method for RF shielding," IEEE International Symposium on Circuits and Systems, pp. 1771-1774, doi: 10.1109/ISCAS.2009.5118119, May 2009.

B. Razavi, RF Microelectronics. Upper Saddle River, NJ: Prentice-Hall, 1998, section 7.6 (monolithic inductors).

C.P. Yue and S.S.Wong, "A study of substrate effects of silicon-based RF passive components," 1999 IEEE MTT-S International Microwave Symposium Digest, pp. 1625-1628, Jun. 1999.

C.B. Sia et al., "Effects of polysilicon shield on spiral inductors for silicon-based RF IC's," 2001 IEEE International Symposium on VLSI Technology, Systems, and Applications, Proceedings of Technical Papers, pp. 158-161, Apr. 2001.

T.D.S. Cheung et al., "Differentially-shielded monolithic inductors," in Proc. IEEE Custom Integrated Circuits Conf. (CICC), pp. 95-98, Sep. 2003.

Y.R. Kwon, V.M. Hietala, and K.S. Champlin, "Quasi-TEM analysis of "slow-wave" mode propagation on coplanar microstructure MIS transmission lines," IEEE Trans. Microwave Theory Tech., vol. MTT-35, No. 6, pp. 545-555, Jun. 1987.

P.J. Petersan and S.M. Anlage, "Measurement of resonant frequency and quality factor of microwave resonators: comparison of methods," J. Appl. Phys., vol. 84, No. 6, pp. 3392-3402, Sep. 1998.

C.N. Chen and D.I. Hoult, Biomedical Magnetic Resonance Technology. New York, NY: IOP Publishing Ltd., 1989, section 4.6 (Signal and Noise, Practical Points). This citation describes a measurement method that was adapted by Applicant for characterizing the Qs and self-resonance frequencies of inductive-capacitive LC circuits.

\* cited by examiner

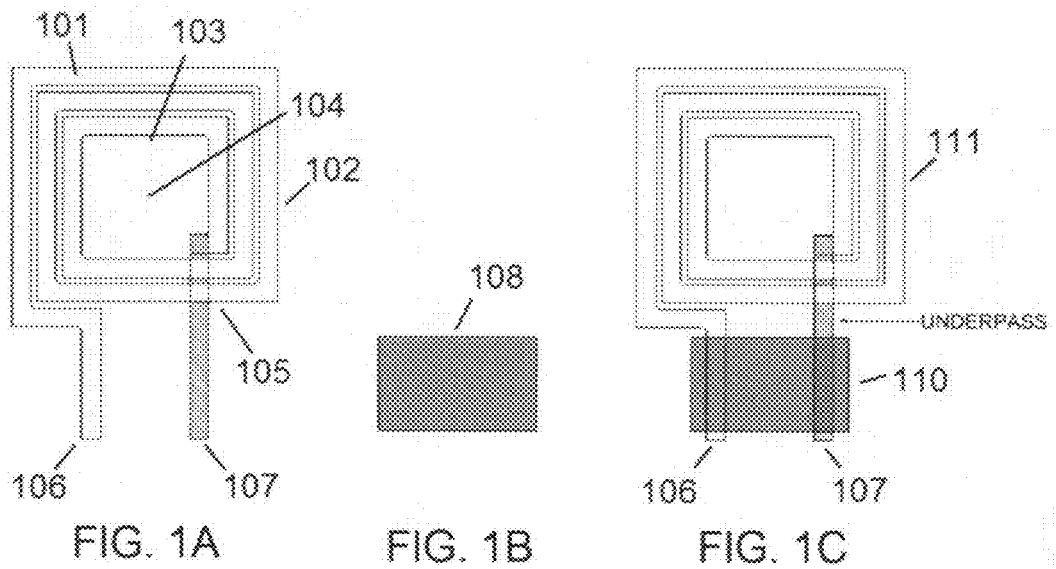

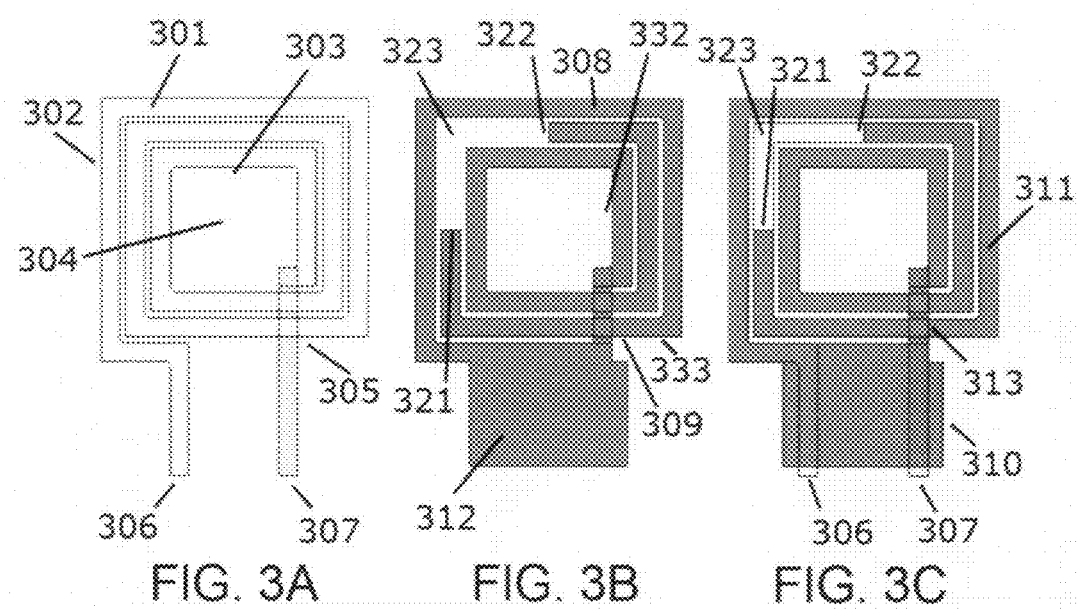

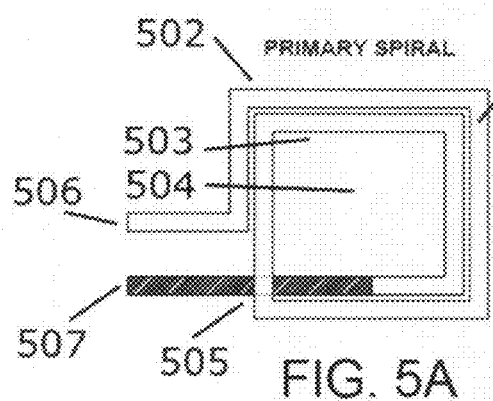
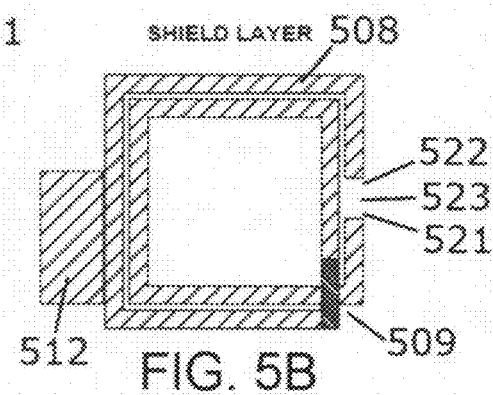
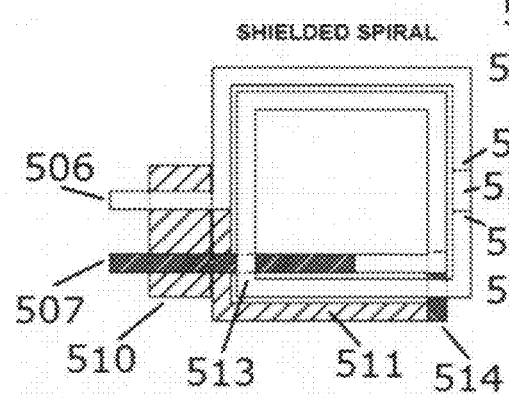
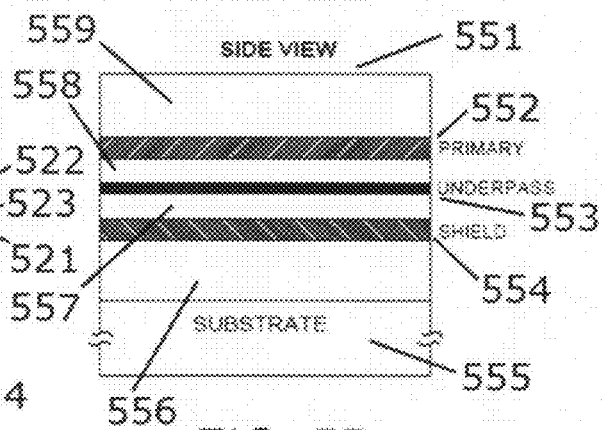

ered conductive path. The plates are conductor. T

COMPACT-AREA CAPACITIVE PLATES FOR USE WITH SPIRAL INDUCTORS HAVING MORE THAN ONE TURN

RELATED APPLICATIONS

The present invention claims priority of and is a conversion of U.S. Provisional Patent Application No. 61/395,831 filed May 17, 2010 and titled "COMPACT-AREA CAPACITIVE PLATES FOR USE WITH SPIRAL INDUCTORS HAVING MORE THAN ONE TURN." The contents of such provisional patent application are incorporated herein by reference.

FIELD OF THE INVENTION

The field of the invention relates generally to electrical circuits, and more specifically to electrical inductors and inductive-capacitive circuits (LC circuits), also called "(LC)-tank" circuits.

BACKGROUND OF THE INVENTION

The invention is concerned with the general style of inductor commonly used on layered supportive media, such as printed circuit boards (PCBs), semiconductor chips, and integrated circuits (ICs). These types of inductors are often referred to as "spiral inductors." Spiral inductors, and resonant circuits containing spiral inductors, are used, for example, in radio frequency and microwave (RF/MW) circuits, including, but not limited to, filters, tuned circuits, matching circuits, RFD devices, and biomedical devices.

Often, a spiral inductor is part of an inductive-capacitive LC circuit. Frequently, such LC circuits are used as building blocks for larger circuits. In order to build an LC circuit, it is common for the circuit designer to add capacitance to the LC circuit in a region near the spiral inductor in order to augment the self-capacitance associated with the spiral inductor itself. This added capacitance can take up valuable area in the circuit layout. Frequently, circuit designers look for methods of reducing layout area and reducing the number of components when designing electrical circuits.

A spiral inductor can exhibit higher-than-desired energy loss, depositing energy within its conductive trace and in matter surrounding the trace. Energy loss is often quantified in terms of a unitless quality factor (Q). Circuit designers frequently aim to reduce energy loss in circuits.

When a spiral inductor is used in an electrical circuit, energy losses occur as a result of interaction of the physical circuit with the spiral inductor's E- and B-fields. This loss is due to: (1) currents and resistance in the spiral inductor's own conductive trace; and (2) the interaction of the inductor's E- and B-fields with matter external to the conductive trace of the inductor.

Consider a spiral inductor 101 having more than one turn. As the conductive trace that defines the spiral inductor approaches the central region 104 of a spiral pattern, an underpass 105 (or an overpass) is usually utilized to bring the inductor's inside lead 107 (its inner electrical terminal) to the outside of the spiral's outer perimeter 102. The connective feature of an underpass 105 (or an overpass) is usually necessary for the circuit, and complicates to some degree the layout of spiral inductor circuits. This complication is partly because a second conductive layer is needed, together with electrical connections that extend to the trace of the underpass (or overpass) layer from the trace of the spiral inductor.

The LC circuits and subcircuits based on this invention do not need to operate at their resonance frequency. Inductive-capacitive circuits can also operate at frequencies above or below their resonance frequencies.

A spiral inductor, having a first terminal 106 (or first "lead") and a second terminal 107 (or second "lead"), is laid out on an insulating substrate either by etching or otherwise forming a conductive trace in a spiral pattern, which is known in the art of electrical circuit design. As the layout of the spiral's trace 101 (conductive path) winds toward the central region 104 of the spiral pattern, an underpass 105 (or an overpass) is utilized to bring the inductor's inner lead (inner terminal) to the outside 102 of the spiral from the inner region of the spiral 104, to permit easier connection to an electrical circuit. This underpass 105 (or overpass) is connected to the primary spiral with vertically oriented conductive segments or "vias." The use of vias is a general technique that is known in the art of circuit design. Sometimes, the spiral inductor stands alone, and is used alone, without direct conductive electrical connection to a circuit. In this case, electrical energy is coupled into the primary spiral inductor and out of the spiral inductor electrically and magnetically.

A circuit's energy efficiency affects crucial performance parameters such as power consumption, electrical heating, random noise, phase noise, and circuit sensitivity. A useful figure-of-merit when characterizing an LC circuit is the tank-Q or "$Q_{TANK}$." The unitless value of tank-Q quantifies electrical energy loss. In lower-Q circuits, a greater amount of energy is lost compared to higher-Q circuits due from the interaction of the inductor's E- and B-fields with itself and with surrounding matter. Some types of matter interact more substantially with the E- and B-fields. In particular, some materials, including electrical conductors, dielectrics with nonzero loss tangents, and semiconductors, can interact in an electrically parasitic manner with an inductor's electric and magnetic (E- and B-) fields. These interactions result in circuit energy that is deposited as heat energy. Thus, a higher value for the Q-factor indicates, in general, better circuit performance and less electrical heating.

For a spiral inductor circuit, particularly for those that form of inductor-capacitor (LC) circuits, the total layout area is another important figure-of-merit. The circuit designer generally prefers compact layouts in order to conserve valuable circuit area and to reduce parasitic effects in circuits. In the art of electrical design, LC circuits and LC subcircuits (i.e., smaller circuits that are sometimes used as building blocks) are commonly achieved by laying out parallel plate capacitance 708 near the inductor's two terminals or by attaching discrete capacitors across the inductor's two terminals, or in series with either or both of the inductor's two terminals.

To improve the Q-factor for a spiral inductor's inductance-capacitance circuit, techniques have been developed in the circuit design arts to help shield, terminate, or redirect the spiral inductor's E-fields away from the surrounding higher-loss matter. Usually, in the art, this involves designing a conductive pattern for placement under the spiral inductor in the region between the primary spiral inductor and the lossy media. (The conductive pattern may also be placed above the spiral inductor.) The conductive pattern is comprised of metal or other conductor and is sometimes referred to as a "plate" or "shield." For example, in the art, these conductive trace patterns are placed in an intermediate layer or in intermediate layers, below the bottom surface of the spiral inductor and above nearby lossy materials, on a separate conductive layer or layers. (A high-loss or "lossy" dielectric material is a dielectric with a non-zero loss tangent.) In the art, these conductive plates typically have patterns cut into them, forming strips of conductor with non-conducting gaps. In the art, shields fabricated from a fully continuous layer of metal—without specific patterns cut or etched into it—have also been used for shielding the inductor's E-fields.

In circuits, a spiral inductor's energy loss can result in heating, and this heating can exacerbate the circuit's unwanted energy loss further because most materials have a positive temperature coefficient of resistance. Shields in the form of patterned conductive plates have been devised in the art to lessen this energy loss, but often have limitations of their own, including limited Q-factor values, consumption of layout area, necessary ground connections, or insufficient capacitance (in cases where capacitance is desired)

SUMMARY

Embodiments of the present invention include a method and an apparatus.

The term "primary spiral inductor" refers to the first inductor, i.e., the inductor to which capacitance is to be added.

An embodiment of the invention includes a primary spiral inductor 301 and a capacitive plate 308 where the capacitive plate 308 is placed directly underneath the bottom surface of the primary spiral inductor. The capacitive plate 308 is comprised of a conductive trace pattern etched or otherwise formed using a conductive layer. It is also possible to place the capacitive plate 308 directly above the top surface of the primary spiral inductor, and it's possible to place two capacitive plates, one above and one below the top and bottom surfaces of the primary inductor.

The capacitive plate 308 in this invention is electrically floating: it is not connected to an electrical ground and is not directly electrically connected (no direct conductive contact) with the corresponding primary spiral inductor 301. The primary spiral inductor 301 and corresponding conductive capacitive plate 308 are electrically insulated from each other. Here, the term "insulated" refers to being electrically insulated in the usual sense: high electrical resistance between structures, thus resisting current.

Particular embodiments include designing and placing a capacitive plate 308 that is positioned directly underneath the overlying primary inductor 301, resulting in a superposition 311. The shape of this capacitive plate 308 substantially follows the shape of the trace of the overlying primary inductor 301. One intention of this invention is to add capacitance to the primary spiral inductor 301 so that a compact inductance-capacitance structure 311 is achieved. Another intention of this invention is for the designed capacitive plate to serve as a partial RF shield for the primary spiral inductor. This shielding is desired to help reduce or redirect the spiral inductor's E-fields in order to lessen interactions with surrounding lossy materials.

The term "primary spiral inductor" also refers to the primary spiral inductor's conductive trace. The circuit designer places underneath the bottom surface—or above the top surface—of the primary spiral's conductive trace a second trace pattern (called a "capacitive plate") in order to add capacitance in a compact manner. Added capacitance to an inductive-capacitive LC circuit can be motivated by many circuit-related reasons, regardless of E-field or B-field shielding.

An embodiment of this invention can be visualized by starting with a primary spiral inductor 301 that has more than one turn. This primary inductor therefore usually has an underpass 305 or an overpass (underpass/overpass) so that the second of its two terminals 307 (leads) can be connected to the outside of the outer perimeter 302 of the primary spiral inductor. Overpasses and underpasses are well known in the art and require at least one additional conductive layer so that the turns of the primary spiral inductor do not short circuit to each other. Now, duplicate this primary spiral inductor and place this second (duplicate) inductor and its overpass (or its underpass) on another set of conductive layers directly underneath the original primary spiral inductor. Two inductors, a primary spiral inductor and a second (duplicate) spiral inductor, which for this example are copies in shape and in size, are now directly superimposed on each other but not touching each other directly. They are insulated from each other electrically by vacuum or by at least one insulating material. This duplicate inductor is referred to as a "capacitive plate." The next step is to extend the trace pattern of the duplicate inductor so that the two terminals of this second inductor (the capacitive plate) are conductively connected 312 across its terminal region, in a region that at least partially overlaps each of the two terminals 306, 307 of the primary spiral inductor. Referred to as "spanning the terminals," this conductive connection on this duplicate second spiral inductor does not physically contact the primary spiral inductor, as it simply connects the two terminals of the second spiral inductor (the capacitive plate). Next, a nonconductive gap 323 is inserted somewhere along the conductive trace path of the second spiral inductor (the capacitive plate) to inhibit eddy currents. The resulting structure 311 is a compact inductance-capacitance circuit.

The capacitive plate 308, as derived by first duplicating the primary spiral inductor 301, need not be a close copy of the primary spiral inductor 301, either in terms of dimensions or material. The key features for the capacitive plate are as follows: (1) that it has a trace path 308 that generally follows the trace path of the primary spiral inductor 301; (2) it has a conductive connection 312 across its terminals that corresponds to the region overlapping (at least partially overlapping) the terminals of the primary spiral inductor; (3) it has a nonconductive gap 323 somewhere along the length of its trace; and (4) it is electrically floating. Here, floating means that the capacitive plate's trace pattern has no direct connections to any electrical ground or to other circuit elements, and does not directly electrically connect to the primary spiral inductor.

The phrase "overpass and/or underpass" can be written "overpass/underpass." This means that a jumper 305—extending from the inner perimeter 303 of a spiral trace pattern to the outer perimeter 302 of a spiral trace pattern—can be placed at an insulating distance away above the top surface of a spiral inductor or below the bottom surface of a spiral inductor. And, for a capacitive plate 308 in the shape of a spiral pattern, an overpass/underpass 309 can also be used to connect from the inner perimeter 332 to outside of the outer perimeter 333.

In the case of a primary spiral inductor 301 with more than one turn, then an overpass 305 or underpass (overpass/underpass) is usually needed. This is known in the art for any spiral inductor with more than one turn that needs direct electrical connections to outside of the outer perimeter 302 of the primary spiral inductor 301. For this invention, the primary spiral's 301 corresponding capacitive plate 308, if it has more than one turn, will also have an overpass/underpass 309. Taken together, the two overpass/underpass structures 305, 309 (for the primary inductor and for the capacitive plate) can be overlapping each other 313, or they can be spatially offset 513, 514, i.e., nonoverlapping each other. If they overlap, then a total of four conductive layers are needed to realize the invention so that the primary spiral inductor, capacitive plate, and underpass/overpass structures do not touch each other. If the overpass/underpass structures 505, 509 are nonoverlapping, then at least three conductive layers 552, 553, 554 are needed.

Particular embodiments may provide all, some, or none of these aspects, features, and advantages. Particular embodiments may provide one or more other aspects, features, and advantages, one or more of which may be readily apparent to a person skilled in the art, as taught from the figures, descriptions, and claims herein.

BRIEF DESCRIPTION OF THE DRAWINGS

FIG. 1a depicts a 3-turn conductive trace 101 for a typical spiral inductor that can serve as a primary spiral inductor.

FIG. 1b is a rectangular-shaped floating capacitive plate 108 for spanning the terminals only.

FIG. 1c is a superposition of the rectangular capacitive plate 108 shown in FIG. 1b on top of the structure shown in FIG. 1a, depicting an inductance-capacitance LC structure 111 that includes the spiral inductor and its floating plate 110. When superimposed as shown in FIG. 1c, the metal or conductor of FIG. 1a does not touch the metal or conductor of the plate shown in FIG. 1b, there is a finite separation distance between them. In this case, the floating capacitive plate 110 is a simple rectangle that spans the leads 106, 107 of the primary inductor, and the metal or conductor of the floating plate does not extend further into the area defined by the spiral's turns.

FIG. 2a depicts a 2.5-turn conductive trace 201 for a typical spiral inductor that could serve as a primary spiral inductor.

FIG. 2b depicts a capacitive plate 208 for spanning the leads of the 2.5-turn spiral inductor 201 shown in FIG. 2a.

FIG. 2c is a superposition of the structure shown in FIG. 2b on top of the structure shown in FIG. 2a, depicting the structure of spiral inductor together with its floating plate. In this case, the floating plate spans the leads 206, 207 of the primary inductor and the floating plate 208, 210 does not extend further into the area defined by the spiral turns. For the assembly depicted in FIG. 2c, the metal or conductor of the spiral inductor 201 shown in FIG. 2a does not touch the metal or conductor of the spanning conductor 208, 210 shown in FIGS. 2b and 2c; there is a finite separation between the conductor layers used.

FIGS. 3a, 3b, and 3c depict an embodiment of this invention. FIG. 3a depicts a 3-turn spiral conductive trace 301 for a typical spiral inductor that can serve as a primary spiral inductor.

FIG. 3b depicts a capacitive plate 308 for spanning the leads of the 3-turn primary spiral, and this plate extends into the area of the spiral turns of the spiral inductor. This figure shows a capacitive plate that is substantially the same shape as the primary spiral inductor, and has at least one gap 323, and the trace is shaped to span the terminal leads 306, 307 of the primary inductor.

FIG. 3c depicts a superposition of the structure shown in FIG. 3b on top of the structure shown in FIG. 3a, showing the inductance-capacitance LC structure 311 of spiral inductor and its floating capacitive plate.

FIG. 4a depicts a 2.5-turn spiral inductor conductive trace 401 that can serve as a primary spiral inductor.

FIG. 4b depicts a capacitive plate 412 for spanning the leads of the 2.5-turn primary spiral, and extending into the area of the spiral turns of the primary spiral inductor. This figure shows a capacitive plate 412 that is substantially the same shape as the primary spiral inductor 401, and has at least one gap 423, and spans the terminal leads 406, 407 of the primary inductor, thus capable of forming a compact inductance-capacitance structure 411.

FIG. 4c is a superposition of the structure shown in FIG. 4b on top of the structure shown in FIG. 4a, depicting the structure of the primary spiral inductor 401 and its floating capacitive plate 412.

FIGS. 5a, 5b, 5c, and 5d depict an embodiment of this invention. FIG. 5a depicts a 2-turn spiral conductive trace 501 that can serve as a primary spiral inductor.

FIG. 5b depicts a capacitive plate 508 for spanning the leads 506, 507 of the 2-turn primary spiral, and for extending into the spiral area of the primary inductor. There is one gap 523 in the capacitive plate, as shown. This gap has a beginning 522 and an end 521, and the gap length is the distance along the trace corresponding to the difference in these positions.

FIG. 5c depicts a superposition of the structure shown in FIG. 5b on top of the structure shown in FIG. 5a, showing the primary spiral inductor and its floating capacitive plate together. In this case, the floating capacitive plate spans the leads of the primary inductor 506, 507, and the floating capacitive plate does extend further into the area defined by the spiral turns.

FIG. 5d is a cross-sectional example view 551 of the layers 552, 553, 554, 555, 556, 557, 558 of the conductors and substrate. The layered substrate can be comprised of many layers of any combination of conductor, semiconductor, or dielectric.

FIG. 6a depicts a 3-turn spiral conductive trace 601 for a typical spiral inductor, which can be used as a primary spiral inductor.

FIG. 6b depicts a capacitive plate for spanning the terminal leads 606, 607 of the 3-turn primary spiral, and this plate extends into the area of the spiral turns of the spiral inductor. This figure shows a capacitive plate 608 that is substantially the same shape as the primary spiral inductor depicted in FIG. 6a, and has at least one gap 624, and spans the terminal leads 606, 607 of the primary inductor. The gap has a beginning 625 and an end 623, thus forming a long gap 624. The physical extent of the trace pattern of this capacitive plate is less than the capacitive plate for the 3-turn inductor shown in FIG. 3b (i.e. there is a longer gap in the shield depicted in this figure).

FIG. 6c is a superposition of the structure shown in FIG. 6b on top of the structure shown in FIG. 6a, showing the structure of spiral inductor and its floating capacitive plate together 611.

FIG. 9 illustrates a top view of a two-turn spiral with a two-turn projected shield: (a) primary spiral; (b) projected shield with two key features—the gap and the terminal span; and (c) assembly as a direct superposition. In the arrangement shown here, the shield's gap is positioned so that an underpass for the shield is not needed.

FIG. 10 shows a plot of both tank Q and $\omega_0$ as a function of gap length for a 1-turn microstrip inductor. Gap length is expressed as a percentage of the total length of spiral's trace. Here, the data are fit to 2nd-order polynomials.

DETAILED DESCRIPTION

Figures 2A, 2B, 2C:
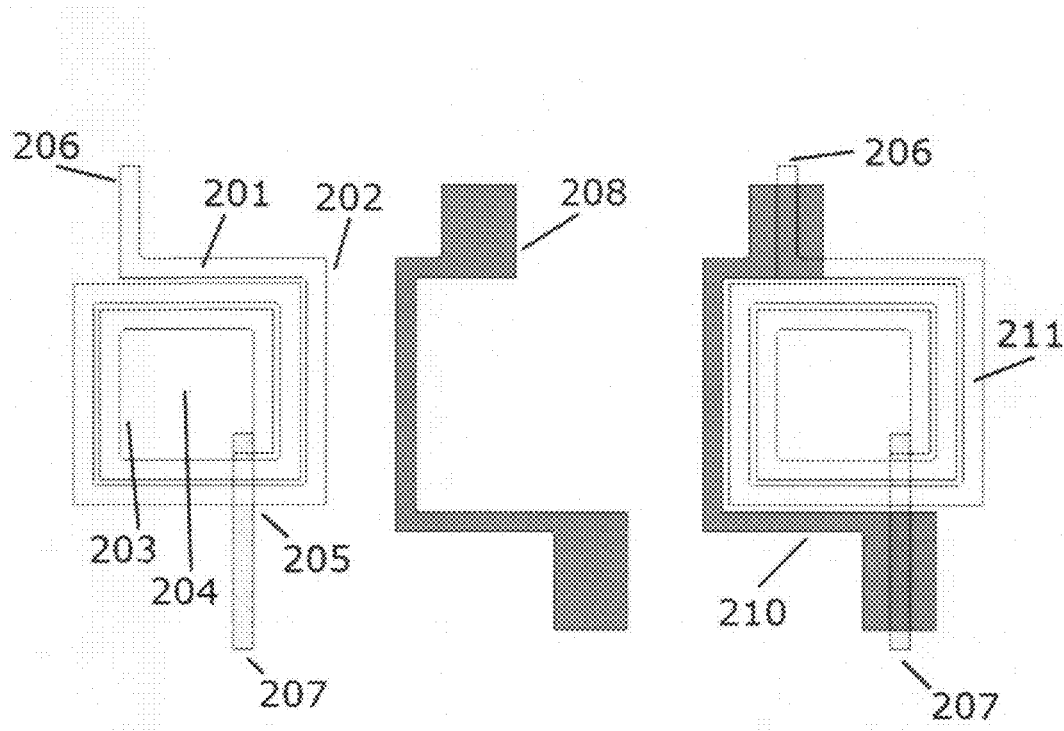

Presented herein is a method and apparatus for constructing a compact inductive-capacitive LC circuit. This method helps a designer save area when laying out a circuit, without adversely affecting the Q-factor. In some designs, a higher-than-expected Q-factor is realized, compared to Q-factors obtained with conventionally laid-out intermetal plate capacitance or electrically attached discrete capacitive components.

TERMINOLOGY

The following terminology used herein is related to the process of producing compact inductive-capacitive LC circuits. Inductive-capacitive LC circuits are also referred to by other terms, including LC circuits, (LC)-tank circuits, RLC circuits, or inductance-capacitance circuits.

In this specification, the magnetic field is represented by the magnetic flux density, as the capital letter "B." The electric field is represented by a capital "E."

In this specification, the term "primary spiral inductor" refers to the first inductor, i.e., the inductor to which capacitance is to be added. The primary spiral inductor is sometimes called by other terms, including "primary spiral" and "primary inductor."

The "X-Y plane" is defined here as the overall plane of a given spiral shaped conductive trace, having a top surface and a bottom surface.

The "X'-Y' plane" is defined here as the overall plane of the capacitive plate, having a top surface and a bottom surface.

The vertically oriented direction is referred to as the "Z" direction. This is the direction that connective vias traverse in order to connect different conductive layers, i.e., to make an interlayer electrical connection.

In this specification, "substantially conductive" means any material that has a conductivity that is similar to, or greater than, materials that include polysilicon, silicide-polysilicon, silver, gold, aluminum, copper, or any conductive composition comprised of these materials.

In this specification, the terms "shield," "plate," "capacitive plate," "projected shield," "floating plate," and "floating shield" all refer to the same entity: the conductive plate that is used together with a primary spiral inductor to add capacitance and/or to help shield, reduce, or redirect E-fields.

The terms "underpass" and "overpass" are used to indicate a method common in the art of electronics that permits connection from the inside of the inner perimeter of a spiral to the outside of the outer perimeter of a spiral. This connection is also called a "jumper." For example, an overpass brings the inner terminal (inner lead) to a point outside the outer perimeter of the spiral by passing the conductor over the top surface of the spiral. And an underpass permits the inner terminal to reach the outer perimeter of the spiral by passing over the bottom side of the spiral. Connections are made to underpasses and overpasses using one or more conductive vias (conductive vertically oriented electrical connections) that extend generally normally to the plane of the spiral inductor or capacitive plate. A via is also called an "interlayer electrical connection." The technologies of underpasses, overpasses, jumpers, and interlayer connections are well known in the art of electrical design. In this invention, the device can be made with any combination of underpasses or overpasses, and thus this type of electrical connection is referred to as an "underpass/overpass" to imply both possibilities.

The word "via" refers to any electrical connection that permits connection between two or more conductive layers in a circuit layout.

The term "substantially" is meant to convey a wide range of conditions. It has been found from experiments and from simulations that for this invention, a wide range of conditions can be tolerated to provide a compact capacitive effect. For example, substantially conductive means that conductivities can range, for example, from below that of polysilicon and silicide-polysilicon to traditional conductive metals or alloys such as gold, silver, copper, or aluminum. Substantially planar means that traditional layouts are on flat PCBs or semiconductors; however PCBs can be flexible and can therefore have a final nonplanar appearance at, for example, a specified maximum bend radius. In addition, inductance-capacitance LC structures as disclosed here can be built on non-planar forms, such as cylindrical forms directly, using layered non-planar conductors and insulators, or by using layered planar conductors and insulators that can be bent or formed.

The term "substantially congruent," or "substantially overlapping," means that that the primary spiral and its capacitive plate need not be perfectly matched in shape and material to gain a capacitive effect. The width (W) of the trace of the primary inductor and the width of the trace of the capacitive plate can differ by as much as a factor of ten. The intra-trace spacings (S) can also vary. Furthermore, the overall alignment with respect to the X-Y and X'-Y' planes (the X-Y plane is the plane of the layer of the primary spiral inductor, and the X'-Y' plane is the plane of the layer of the capacitive plate) can be offset by as much as a full trace width W. The conductor thickness (t) of the primary spiral inductor and the capacitive plate can vary greatly with little effect on this invention, even when the thickness of the conductive trace is less than the so-called "RF skin thickness." However, it has been found experimentally and by simulations that the capacitive effect increases as the geometries and alignments of the primary spiral and the capacitive plate become more congruent.

This invention is scalable to smaller and larger sizes. In addition to a design where the primary spiral inductor's outer dimension is 3.0 cm and fabricated as a microstrip layout on PCB, other sizes and materials have been investigated. Simulations have shown that scaling applies to inductance-capacitance LC structures that are 300 microns in outer dimension, i.e., scaled 100 times smaller than the structures described for PCB. These smaller-scale inductance-capacitance LC structures were modeled using layered semiconductor materials—having the requisite conductive layers—and suitable for CMOS microelectronic technology. The trace thicknesses (t) for these structures were approximately 3 microns thick, ten times thinner than for the PCB structures. For these CMOS-style models, the interlayer distances were on the order of 1 to 50 microns. Resonant frequencies for these smaller structures ranged in simulations from 1 to 10 GHz. In summary, in addition to actual physical implementation on PCB, studies have been done on models using finite element simulators demonstrating a wide range of scalability, in overall size, in layer thickness, in trace dimensions including trace thickness, in materials, and in resonance frequency of the inductive-capacitive LC circuit.

The conductive layers need not be perfectly parallel to each other, as they can be tilted with respect to each other, to some degree, and maintain a capacitive effect. The main goal is that the primary spiral inductor and its capacitive plate should not be in direct electrical contact with each other (which means they should not be directly touching). The spacing between these two structures can affect the total capacitance of the inductive-capacitance LC structure. If one layer is tilted with respect to the other layer, a capacitive effect can be observed, nevertheless.

The width of the strip of the capacitive plate's conductor that spans the terminals $W_{SPAN}$ need not be the same width as that shown in the embodiments, as long as the bridging strip is long enough and wide enough to overlap—at least partially—each of the two terminal leads of the primary inductor. The bridging (spanning) of the terminals with at least a partial overlap is important in order to complete the capacitive circuit of the inductance-capacitance LC structure.

The total number of turns of the primary spiral inductor need not be a whole-integer number, and can be—for example—a nonwhole-integer number, such as for inductors with half-integer turns as is shown in FIG. 4, where the primary inductors terminals are on opposite sides of the primary spiral inductor. The strip of plate material that spans the terminals should be lengthened and shaped to span the primary inductor's two terminals, even if the terminals are on opposite sides of the primary spiral inductor. The nonconductive gap in the capacitive plate is positioned along the length of the capacitive plate's trace. A placement of this gap approximately midway along the length of the corresponding trace of the primary spiral inductor generally provides for higher total capacitance. Therefore, the design rules for capacitive plates apply for whole-integer number of turns and for use with primary spiral inductors having a nonwhole-integer number of turns.

The underpass/overpass structures that are used to realize either multi-turn capacitive plates or multi-turn primary spiral inductors are connected to their respective structures by one or more connective vias. This construction of overpass, underpasses, and jumpers is known in the art.

The conductive materials that comprise the primary spiral inductor and the conductive materials that comprise the capacitive plate should not directly electrically contact each other. The primary spiral inductor and the corresponding capacitive plate should be electrically insulated from each other by materials that are not substantially electrically conductive. The primary spiral inductor and the corresponding capacitive plate are electrically and magnetically coupled together, though without direct connections.

The term "spiral inductor" is understood to refer to the shape of inductors commonly used in electrical circuitry (for example, laid out on PCBs, or laid out on integrated circuits or semiconductor), and can have a circular overall shape as its trace winds around a fixed central region 304. A spiral inductor can also have a conductive trace that is rectangular, square, hexagonal, octagonal, or otherwise polygonal in overall shape as it winds around a central region 304.

The gap 323 in the capacitive plate 308—used primarily to deter eddy currents around the electrical trace path that defines the capacitive plate—has a first end 321 and a second end 322. The distance—along the original trace pattern—between the two ends 321, 322 of the gap 323 is the "gap length." The gap can be any nonzero length as long as it does not interrupt the conductive strip that is used to extend the capacitive plate's trace pattern in order to bridge (span) across the region that corresponds to the terminals of the primary spiral inductor. Again, the bridge (the span) of capacitive plate conductor that spans the two terminals 306, 307 of the corresponding primary inductor should not directly touch the primary spiral inductor—i.e., must not be electrically connected to any portion of the conductive trace that defines the primary spiral inductor.

The intermediate layers—the layers of material between the conductive layers that define the primary spiral inductor, the capacitive plate, and the overpasses/underpasses—can include vacuum or materials such as a dielectric, air, semiconductor, or saline or biological tissues. The capacitive plate and the primary spiral inductor must not touch each other directly—they should be separated by electrically insulating layers that are substantially nonconductive.

The surrounding layers beyond the spiral inductor and capacitive plate assembly can be any material. These surrounding materials can include low-loss dielectric (having lower values of loss tangent), lossy dielectric (having higher values of loss tangents), semiconductor, tissue, saline, conductor, air, vacuum, or any material that is used for fabrication of microelectronics.

The overlap between the primary spiral inductor and the capacitive plate need not be full—it can be offset by at least one trace width W, perhaps more. However, for a lesser overlap, the capacitance will be less, and any E-field shielding may or may not be less, than with a more complete overlap.

In one embodiment, 0.036 mm thick layers of copper have trace patterns laid out and photochemically etched on printed circuit board (PCB) to form the traces for the primary spiral inductor and the capacitive plate. The printed circuit board material was RT/Duroid 5880. The entire LC structure was placed above a higher-loss FR-4 dielectric layer for testing. The outer dimension of the primary spiral's trace was 3.0 cm. The vias and overpasses/underpasses were made with individual copper strips, solder, and with 0.025-thick-TEFLON™ sheet as an overpass/underpass insulator. The vias and underpasses/overpasses are also called "jumpers." The pattern for the primary spiral inductor and the capacitive plate were then stacked and secured together to form an inductance-capacitance LC structure. For this embodiment, the trace width W was 2 mm, the spacing between traces (the intra-trace spacing, S) was 0.5 mm, and the number of turns ranged from one to four, including half-integer-turn primary spiral inductors. The thickness of the dielectric layers was 1.5 mm, and the thickness of the TEFLON sheet that was used for making the overpasses/underpasses was 0.025 mm. Resonance frequencies for these inductive-capacitive PCB structures ranged from 0.1 to 1.0 GHz.

In another embodiment, layers of conductor have trace patterns and vias laid out by the circuit designer and then fabricated on multilayer PCB using a standard PCB fabrication process to form the inductive-capacitive LC structure.

In another embodiment, layers of conductor have trace patterns and vias laid out by the circuit designer and then fabricated on semiconductor using a standard semiconductor fabrication process to form the inductive-capacitive LC structure.

FIGS. 3a, 3b, and 3c show an embodiment of this invention. FIG. 3a depicts a 3-turn spiral conductive trace 301 for a typical spiral inductor that can serve as a primary spiral inductor. FIG. 3b depicts a capacitive plate 308 for spanning the leads of the 3-turn primary spiral, and this plate extends into the area of the spiral turns of the spiral inductor. This figure shows a capacitive plate that is substantially the same shape as the primary spiral inductor, and has at least one gap 323, and the trace is shaped to span the terminal leads 306, 307 of the primary inductor. FIG. 3c depicts a superposition of the structure shown in FIG. 3b on top of the structure shown in FIG. 3a, showing the inductance-capacitance LC structure 311 of spiral inductor and its floating capacitive plate. In this case, the floating capacitive plate spans the leads of the primary spiral inductor, and the floating capacitive plate does extend further into the area defined by the spiral turns of the primary spiral inductor. When superimposed as shown in FIG. 3c, the conductor of FIG. 3a does not touch the conductor of FIG. 3b because there is a finite separation between layers of conductor, avoiding direct contact. The overpasses and underpasses 305, 309 of the capacitive plate and primary spiral are not sufficiently offset in the planes of their respective structures 313 (with respect to the X-Y plane of the spiral). Therefore the overall structure requires a total of at least four conductive layers to avoid electrically conductive contact between the capacitive plate and the primary spiral.

Figures 4A, 4B, 4C:
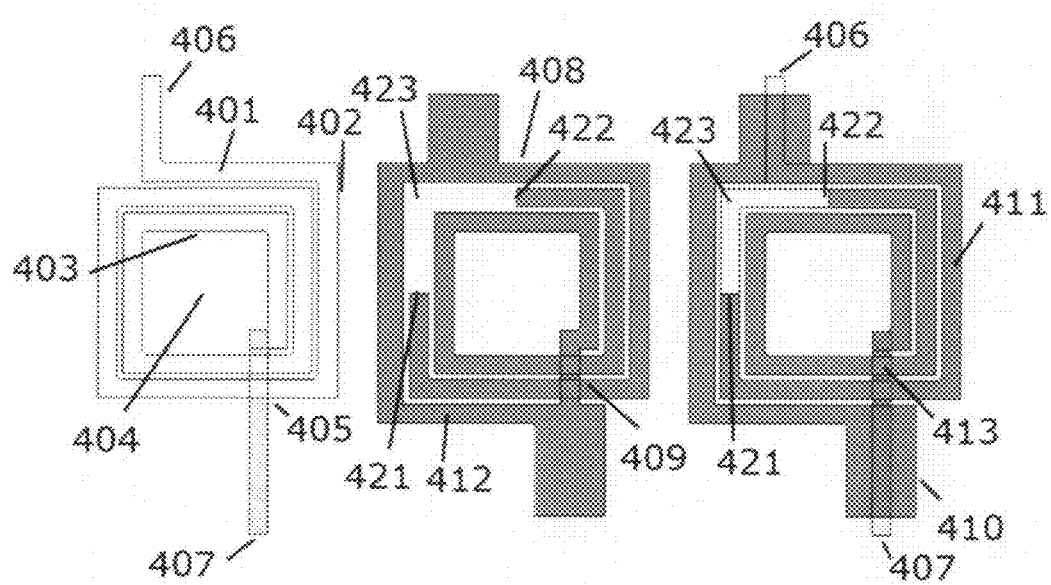
FIGS. 4a, 4b, and 4c depict an embodiment of this invention.

FIGS. 4a, 4b, and 4c show another embodiment of this invention. FIG. 4a depicts a 2.5-turn spiral inductor conductive trace 401 that can serve as a primary spiral inductor. FIG. 4b depicts a capacitive plate 412 for spanning the leads of the 2.5-turn primary spiral, and extending into the area of the spiral turns of the primary spiral inductor. This figure shows a capacitive plate 412 that is substantially the same shape as the primary spiral inductor 401, and has at least one gap 423, and spans the terminal leads 406, 407 of the primary inductor, thus capable of forming a compact inductance-capacitance structure 411. FIG. 4c is a superposition of the structure shown in FIG. 4b on top of the structure shown in FIG. 4a, depicting the structure of the primary spiral inductor 401 and its floating capacitive plate 412. In this case, the floating plate 412 spans the leads of the primary inductor and the floating capacitive plate 412 does extend further into the area defined by the spiral turns of the primary spiral inductor. The metal or conductor of 4a does not touch the metal or conductor of 4b, there is a finite separation, avoiding direct contact. The overpasses and underpasses 405, 409 of the capacitive plate and primary spiral are in a location 413 such that they are close to each other (with respect to the X-Y plane of the spiral). Therefore the overall structure requires a total of at least four conductive layers to avoid metal or conductor contact between the capacitive plate and the primary spiral.

FIGS. 5a, 5b, 5c, and 5d show another embodiment of this invention, with nonoverlapping underpasses/overpasses. FIG. 5a depicts a 2-turn spiral conductive trace 501 that can serve as a primary spiral inductor. FIG. 5b depicts a capacitive plate 508 for spanning the leads 506, 507 of the 2-turn primary spiral, and for extending into the spiral area of the primary inductor. There is one gap 523 in the capacitive plate, as shown. This gap has a beginning 522 and an end 521, and the gap length is the distance along the trace corresponding to the difference in these positions. FIG. 5c depicts a superposition of the structure shown in FIG. 5b on top of the structure shown in FIG. 5a, showing the primary spiral inductor and its floating capacitive plate together. In this case, the floating capacitive plate spans the leads of the primary inductor 506, 507, and the floating capacitive plate does extend further into the area defined by the spiral turns. The conductor of the structure shown in FIG. 5a does not touch the conductor of the structure shown in FIG. 5b; there is a finite separation to avoid direct contact. This is an example of a circuit layout where the overpasses/underpasses are offset, the overpasses and underpasses 505, 509 of the shield and primary spiral inductor are not in the same location (with respect to the X-Y plane of the primary spiral), and therefore the overall structure requires a total of at least three conductor layers. Therefore, the overpass/underpass for the shield (capacitive plate) and for the primary spiral can share one conductor layer. FIG. 5d is a cross-sectional example view 551 of the layers 552, 553, 554, 555, 556, 557, 558 of the conductors and substrate. The layered substrate can be comprised of many layers of any combination of conductor, semiconductor, or dielectric.

Figures 6A, 6B, 6C:
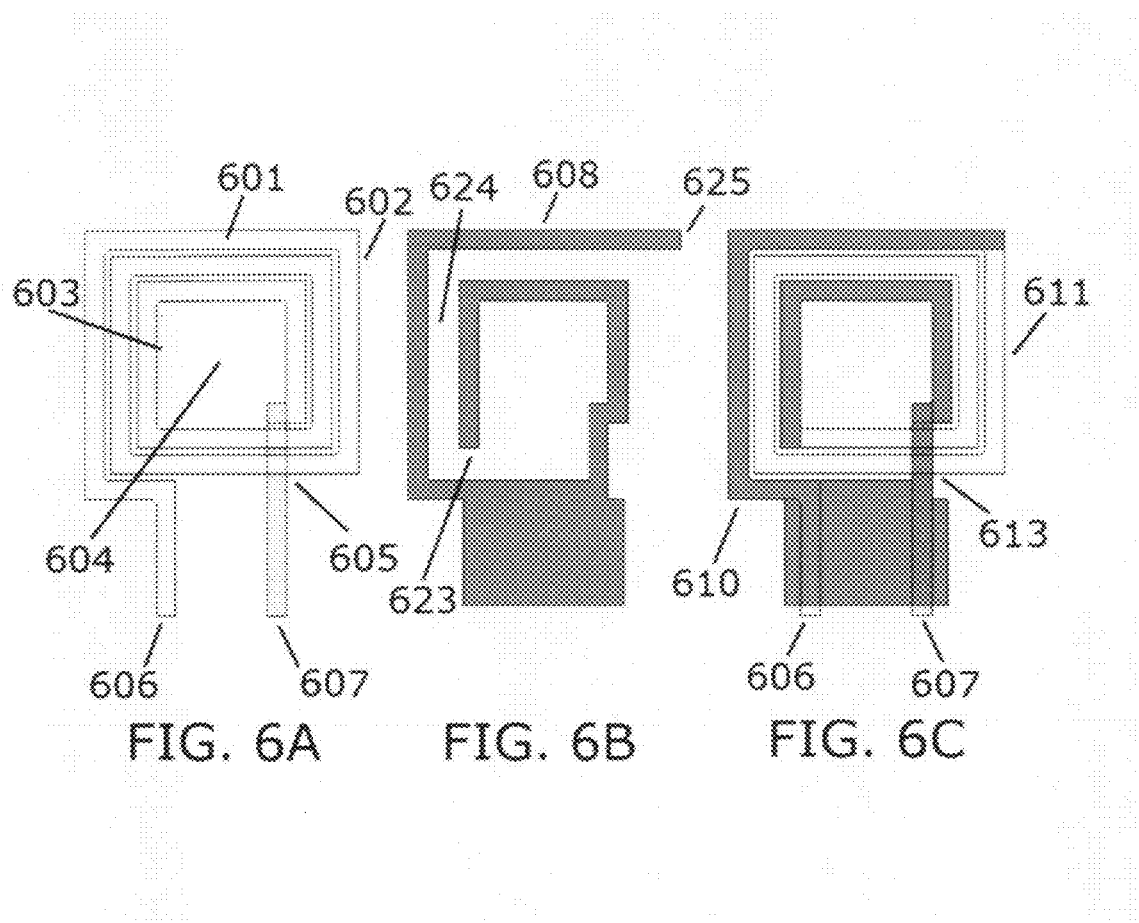
FIGS. 6a, 6b, and 6c depict an embodiment of this invention.
Figure 7A:
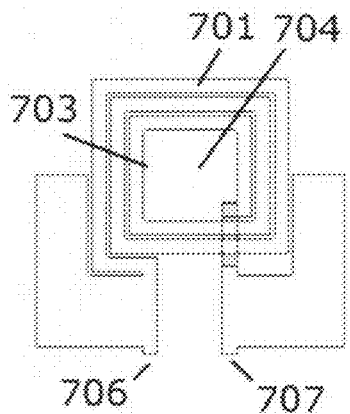
FIG. 7a depicts a 3-turn conductive trace 701 for a typical spiral inductor, which can be used as a primary spiral inductor.
Figure 7B:
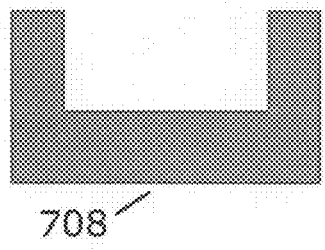
FIG. 7b depicts a conventional-style capacitive plate 708 that is laid out adjacent to the area around the terminals of the primary spiral inductor. This conventional capacitive plate also spans the terminals 706, 707 of the primary spiral inductor.
Figure 7C:
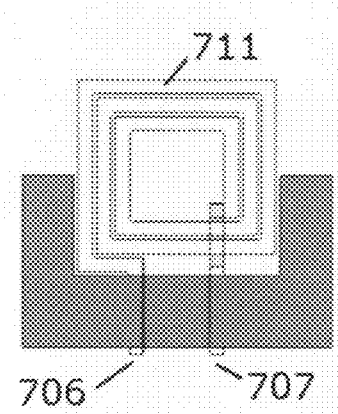
FIG. 7c depicts a superposition of the structure shown in FIG. 7b on top of the structure shown in FIG. 7a, showing the structure of spiral inductor and its floating plate together 711. In the superposition shown in FIG. 7c, the conductor of the structure shown in FIG. 7a does not touch the conductor of the structure shown in FIG. 7b; there is a finite separation to avoid direct contact. In this case shown in FIGS. 7a, 7b, and 7c, the floating plate is a conventional layout of conductor—as intermetal plate capacitance—in a region near the terminals of the primary spiral, which spans the leads of the primary inductor. This is a conventional inductance-capacitance LC circuit layout—the conductor of the floating capacitive plate does not extend further into the area defined by the trace pattern of the primary spiral inductor's turns.
Figures 8A, 8B, 8C:
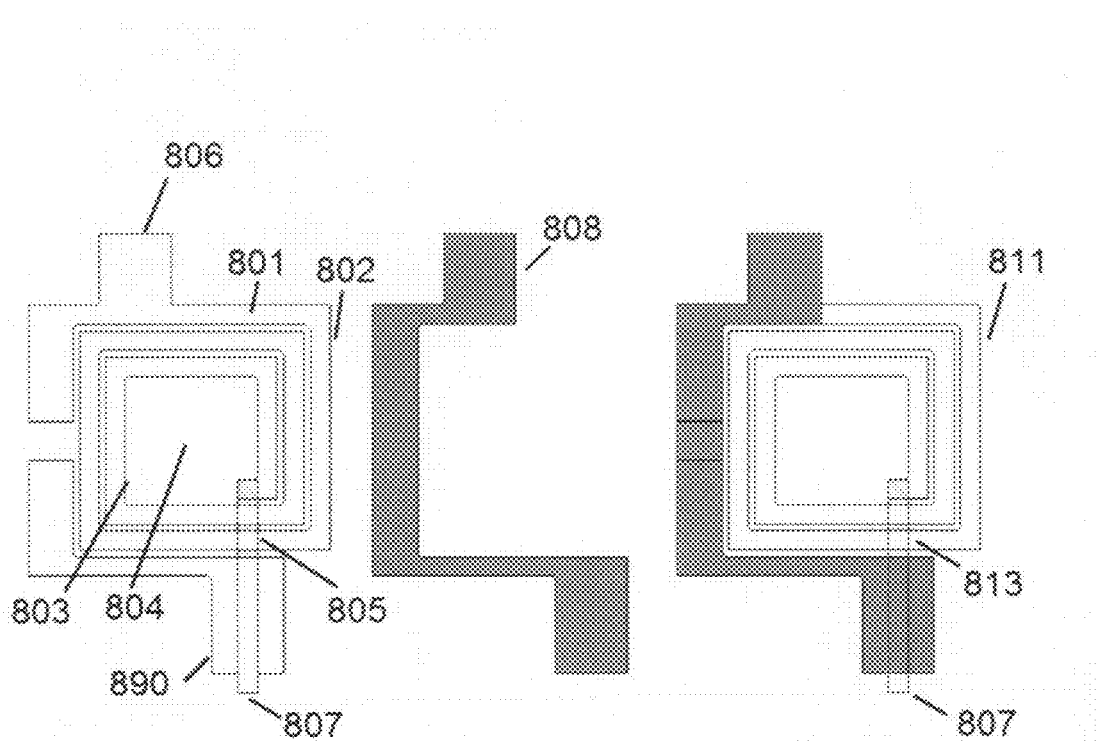
FIG. 8a depicts a 2.5-turn conductive trace for a typical spiral inductor 801 that can serve as a primary spiral inductor.
FIG. 8b depicts a conventional-style capacitive plate 808 for spanning only the terminals 806, 807 of the primary inductor 801, and is thus laid out only in a region adjacent to the area of the primary spiral.
FIG. 8c is a superposition of the structure shown in FIG. 8b on top of the structure shown in FIG. 8a, showing the structure of spiral inductor and its conventional floating plate. For the physical superposition, the metal or conductor of FIG. 8a does not touch the metal or conductor of FIG. 8b, there is a finite separation. The structures shown in FIGS. 8a, 8b, and 8C, are conventional layouts of conductor that span the terminal leads 806, 807 of the primary inductor, and the metal or conductor of the floating capacitive plate does not extend further into the area defined by the primary spiral inductor's turns.

FIGS. 6a, 6b, and 6c show another embodiment of this invention, with a capacitive plate having a long gap. Because of this lengthy gap 624, the capacitive plate does not need an overpass/underpass, and so at least three conductive layers are needed to realize this structure. FIGS. 6a, 6b, and 6c depict an embodiment of this invention. FIG. 6a depicts a 3-turn spiral conductive trace 601 for a typical spiral inductor, which can be used as a primary spiral inductor. FIG. 6b depicts a capacitive plate for spanning the terminal leads 606, 607 of the 3-turn primary spiral, and this plate extends into the area of the spiral turns of the spiral inductor. This figure shows a capacitive plate 608 that is substantially the same shape as the primary spiral inductor depicted in FIG. 6a, and has at least one gap 624, and spans the terminal leads 606, 607 of the primary inductor. The gap has a beginning 625 and an end 623, thus forming a long gap 624. The physical extent of the trace pattern of this capacitive plate is less than the capacitive plate for the 3-turn inductor shown in FIG. 3b (i.e. there is a longer gap in the shield depicted in this figure). FIG. 6c is a superposition of the structure shown in FIG. 6b on top of the structure shown in FIG. 6a, showing the structure of spiral inductor and its floating capacitive plate together 611. In this case, the floating plate 608, 610 spans the terminal leads of the primary spiral inductor 606, 607 and the floating capacitive plate does extend further into the area defined by the turns of the primary spiral inductor. When considering the physical superposition when assembling the structure shown in FIG. 6c, the conductive trace originally shown FIG. 6a does not touch the conductive trace of the pattern originally shown of FIG. 6b, there is a finite separation between layers of conductor, avoiding direct conductive contact. Because of the large gap 624 in the trace pattern of the capacitive Plate 608, the capacitive plate itself does not need an overpass/underpass and therefore the overall structure requires a total of at least three conductor layers to avoid direct electrical contact between the capacitive plate and the primary spiral.

Higher values for quality factors (Q) in resonant tank circuits are desirable in RF/microwave applications because of reduced energy consumption and lower heating. This paper introduces spiral inductors with specially shaped shields that are floating capacitive plates, and are shown as a new and compact method to improve the efficiency of LC tank circuits without process modifications. The proposed shielding technique is intended to complement or improve existing Q enhancement methods. This improvement of Q is from electric field shielding, an effect that reduces energy dissipation caused by capacitive coupling to the surroundings. The effectiveness was demonstrated using microstrip spirals that were 3 cm across. The inductors were 70-270 nH and contributed to resonator frequencies ranging from 200-400 MHz. These test structures show 5-15% higher Qs when evaluated at resonance.

Description of the Projected Shield: The essential features of the projected shield are shown in FIG. 9 for a two-turn spiral inductor. The unshielded inductor is called the "primary spiral." The projected shield has four general attributes: (1) the shield follows the shape of the primary spiral; (2) there is a gap in the shield to deter eddy currents, usually near the midpoint of the trace of the primary spiral; (3) there is a continuous connection of the shield across the primary spiral's terminals; and (4) the shield is floating. FIG. 9 shows a gap 1501, terminal span 1502, and terminals 1503.

Electric fields are stronger near an inductor's terminals, so this region is important for shielding. A rectangular-shaped floating conductor that spans the terminals can offer shielding. Every inductor studied for this work had a rectangular shield across its terminals, placed on the same metal layer as the projected shield. This shielding helped differentiate between losses near the leads and losses associated with the spiral itself. FIG. 5 shows an example. The projected shield is a physical extension of this rectangular shield, with traces extending along the spiral inductor itself.

Effect of Gap Length: Shield Coverage Along the Spiral: To optimize design, a field solver was used to investigate gap length influence on $\omega_0$ and $Q_{TANK}$. In FIG. 10, $Q_{TANK}$ and $\omega_0$ are plotted vs. gap length. As coverage increased, $\omega_0$ decreased because of added capacitance. The maximum Q is at 75% total coverage. Field plots from our HFSS simulations show that E-fields increased at the shield's gap for smaller gaps, reducing the shield's effectiveness.

CONCLUSION

For the microstrip structures studied, the floating projected shield has been shown to increase Q by 5-15% when compared to resonant inductors tuned with conventional plate capacitance. Improvement in Q translates to less energy consumption and less heating.

The inductor and projected shield form a compact, area-efficient LC circuit that has a lower $\omega_0$ than does the unshielded inductor. Because the tank capacitance is integrated into the spiral itself, the layout area using the projected shield was less compared to conventional capacitive tuning.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Although this invention has been described with reference to particular embodiments and examples, other modifications and variations will occur to those skilled in the art in view of the above teachings. It should be understood that, within the scope of the appended claims, this invention may be practiced otherwise than as specifically described.

I claim:

1. A resonant circuit component, comprising:
   an insulating substrate comprised of at least four layers, each layer having opposing first and second surfaces;
   conductive materials comprised of at least three layers, each layer having opposing first and second surfaces, with each of the conductive layers positioned between a pair of the insulating substrate layers;
   a spiral inductor, the spiral inductor being formed in a spiral shape of conductive material on a first conductive layer, with the spiral inductor having more than one turn;
   the spiral inductor residing between opposing first and second surfaces of a first pair of the substrate layers;
   the spiral inductor terminating with a pair of terminals, one at each end of the spiral shape, with the pair of terminals extending outside a periphery of the spiral shape;
   the spiral inductor having at least one overpass or underpass so that the first and second terminals can extend outside the periphery of the spiral shape without direct contact between distal sections of the spiral inductor;
   the overpass or underpass of the spiral inductor is comprised of at least one via and at least one connective conductive segment, the connective conductive segment residing on a second conductive layer between opposing first and second surfaces of a second pair of substrate layers;
   a floating conductive shield made of conductive material residing on a third conductive layer between the second and first surfaces of a third pair of substrate layers, and opposing and following the spiral shape of the spiral inductor;
   the floating conductive shield having at least one overpass or underpass;
   the overpass or underpass of the floating conductive shield is comprised of at least one via and at least one connective conductive segment, the segment being formed on a conductive layer other than the third conductive layer;
   the floating conductive shield spanning the pair of terminals and having a path length measured from a center of a portion that spans the pair of terminals;
   the floating shield having a non-conductive gap in the conductive material, where the gap is positioned to include a middle of the path length of the conductive shield; and
   where the gap has a length that is sufficient to inhibit eddy currents in the floating shield and to enhance a quality factor (Q) of a resulting LC tank circuit component over a value of a Q of the spiral inductor alone, without the floating shield, with the spiral inductor tuned to the circuit's tank frequency with an amount of capacitance placed outside the periphery of the spiral shape.

2. The resonant circuit component according to claim 1, where the length of the floating shield includes a path length of the gap, and where the path length of the gap represents approximately 25 percent of the length of the conductive shield.

3. The resonant circuit component according to claim 1, where the length of the floating shield includes a path length of the gap, and where the path length of the gap represents approximately 50 percent of the length of the conductive shield.

4. The resonant circuit component according to claim 1, where the gap is positioned away from the middle of the conductive shield but not placing a break in the path length of conductive shield that spans the pair of terminals of the spiral inductor.

5. The resonant circuit component according to claim 1, where the insulating substrate comprises a plurality of layers of material, at least one of the plurality of layers comprising an insulating material.

6. A resonant circuit component, comprising:
   an insulating substrate comprised of at least four layers, each layer having opposing first and second surfaces;
   conductive materials comprised of at least three layers, each layer having opposing first and second surfaces, with each of the conductive layers positioned between a pair of the insulating substrate layers;
   a spiral inductor, the spiral inductor being formed in a spiral shape of conductive material on a first conductive layer with the spiral inductor having more than one turn;
   the spiral inductor residing between opposing first and second surfaces of a first pair of the substrate layers;
   the spiral inductor terminating with a pair of terminals, one at each end of the spiral shape, with the pair of terminals extending outside a periphery of the spiral shape;
   the spiral inductor having at least one overpass or underpass so that the first and second terminals can extend outside the periphery of the spiral shape without direct contact between distal sections of the spiral inductor;
   the overpass or underpass of the spiral inductor is comprised of at least one via and at least one connective conductive segment, the connective conductive segment residing on a second conductive layer between opposing first and second surfaces of a second pair of substrate layers;
   a floating conductive shield made of conductive material residing on a third conductive layer between the second and first surfaces of a third pair of substrate layers, and opposing and following the spiral shape of the spiral inductor;
   the floating conductive shield having at least one overpass or underpass;
   the overpass or underpass of the floating conductive shield is comprised of at least one via and at least one connective conductive segment, the segment being formed on a conductive layer other than the third conductive layer;
   the floating conductive shield spanning the pair of terminals and having a path length measured from a center of a portion that spans the pair of terminals;
   the floating shield having a non-conductive gap in the conductive material, where the gap is positioned to include a middle of the path length of the conductive shield;
   where the length of the floating shield includes a length of the gap;
   where the length of the gap is at least 25 percent of the path length of the conductive shield; and
   where the gap has a length that is sufficient to inhibit eddy currents in the floating shield and to enhance a quality factor (Q) of a resulting LC tank circuit component over a value of a Q of the spiral inductor alone, without the floating shield, with the spiral inductor tuned to the circuit's tank frequency with an amount of capacitance placed outside the periphery of the spiral shape.

7. The resonant circuit component according to claim 6, where the length of the gap is approximately 50 percent of the pr length of the conductive shield.

8. The resonant circuit component according to claim 6, where the gap is positioned away from the middle of the conductive shield but not placing a break in the path length of conductive shield that spans the pair of terminals of the spiral inductor.

9. The resonant circuit component according to claim 6, where the insulating substrate comprises a plurality of layers of material, at least one of the plurality of layers comprising an insulating material.

10. A resonant circuit component, comprising:
- an insulating substrate comprised of at least four layers, each layer having opposing first and second surfaces;
- conductive materials comprised of at least three layers, each layer having opposing first and second surfaces, with each of the conductive layers positioned between a pair of the insulating substrate layers;
- a spiral inductor, the spiral inductor being formed in a spiral shape of conductive material on a first conductive layer, with the spiral inductor having more than one turn;
- the spiral inductor residing between opposing first and second surfaces of a first pair of the substrate layers;
- the spiral inductor terminating with a pair of terminals, one at each end of the spiral shape, with the pair of terminals extending outside a periphery of the spiral shape;
- the spiral inductor having at least one overpass or underpass so that the first and second terminals can extend outside the periphery of the spiral shape without direct contact between distal sections of the spiral inductor;
- the overpass or underpass of the spiral inductor is comprised of at least one via and at least one connective conductive segment, the connective conductive segment residing on a second conductive layer between opposing first and second surfaces of a second pair of substrate layers;
- a floating conductive shield made of conductive material residing on a third conductive layer between the second and first surfaces of a third pair of substrate layers, and opposing and following the spiral shape of the spiral inductor;
- the floating conductive shield spanning the pair of terminals and having a path length measured from a center of a portion that spans the pair of terminals;
- the floating shield having a non-conductive gap in the conductive material, where the gap is positioned to include a middle of the path length of the conductive shield; and
- where the gap has a length that is sufficient to inhibit eddy currents in the floating shield and to enhance a quality factor (Q) of a resulting LC tank circuit component over a value of a Q of the spiral inductor alone, without the floating shield, with the spiral inductor tuned to the circuit's tank frequency with an amount of capacitance placed outside the periphery of the spiral shape.

11. The resonant circuit component according to claim 10, where the insulating substrate comprises a plurality of layers of material, at least one of the plurality of layers comprising an insulating material.

* * * * *